(12) United States Patent
Stevens

(10) Patent No.: US 8,081,361 B2
(45) Date of Patent: Dec. 20, 2011

(54) CARBON NANOTUBE SIGNAL MODULATOR AND PHOTONIC TRANSMISSION DEVICE

(75) Inventor: Ramsey M. Stevens, Danville, CA (US)

(73) Assignee: Carbon Design Innovations, Inc., Burlingame, CA (US)

( * ) Notice: Subject to any disclaimer, the term of this patent is extended or adjusted under 35 U.S.C. 154(b) by 1287 days.

(21) Appl. No.: 11/786,492

(22) Filed: Apr. 11, 2007

(65) Prior Publication Data

US 2010/0142017 A1 Jun. 10, 2010

(51) Int. Cl.
- G02F 3/00 (2006.01)
- G02F 1/03 (2006.01)
- G02F 1/07 (2006.01)

(52) U.S. Cl. ........ 359/108; 359/244; 359/245; 977/742; 977/932

(58) Field of Classification Search .......... 359/107–108, 359/237–238, 240–241, 244–246, 252, 254–255, 359/259, 276, 278–279, 290–291, 293–294, 359/321; 977/724–752, 762, 765–766, 758, 977/788, 814, 834, 842–848, 932, 936, 938, 977/940–950, 963

See application file for complete search history.

(56) References Cited

U.S. PATENT DOCUMENTS

| | | | |
|---|---|---|---|
| 6,589,835 B2 | 7/2003 | Chang | |
| 6,759,653 B2 | 7/2004 | Nakayama et al. | |
| 6,827,979 B2 | 12/2004 | Mirkin et al. | |
| 7,033,647 B2 | 4/2006 | Tang et al. | |
| 7,144,287 B2 | 12/2006 | Guillorn et al. | |
| 7,601,650 B2 | 10/2009 | Stevens | |
| 7,628,972 B2 | 12/2009 | Stevens | |
| 2002/0001970 A1 | 1/2002 | Becker | |
| 2003/0193707 A1* | 10/2003 | Marhelyuk | 359/238 |
| 2004/0013597 A1* | 1/2004 | Mao et al. | 423/447.1 |
| 2004/0197546 A1* | 10/2004 | Rinzler et al. | 428/311.51 |
| 2005/0191427 A1 | 9/2005 | Wade et al. | |

(Continued)

FOREIGN PATENT DOCUMENTS

JP 200214653 A 7/2003

(Continued)

OTHER PUBLICATIONS

Co-pending U.S. Appl. No. 11/240,173, filed Sep. 29, 2005.

(Continued)

*Primary Examiner* — Stephone Allen
*Assistant Examiner* — Kimberly N Kakalec
(74) *Attorney, Agent, or Firm* — Perkins Coie LLP

(57) ABSTRACT

The present invention contemplates a variety of methods and techniques for fabricating a carbon nanotube (CNT) signal modulator for reducing, eliminating, or enhancing the resonance interaction between photonic elements, and a photonic transmission device that may incorporate the signal modulator. The CNT signal modulator comprises a gate CNT on a substrate in a position for receiving an input photonic signal and an input modulation signal; and transmitting an output photonic signal that is reduced, eliminated, or enhanced through the selection of the input modulation signal; and an input modulation signal sender for sending the input modulation signal to the gate CNT and creating the modulated output photonic signal from the gate CNT. The photonic transmission device can contain a plurality of CNTs, each having functional antenna forms that are capable of a resonance interaction of photons between adjacent CNTs when formed as an array on a substrate. The photonic transmission device can also comprise the CNT signal modulator.

38 Claims, 11 Drawing Sheets

U.S. PATENT DOCUMENTS

| | | | |
|---|---|---|---|
| 2005/0208304 A1 | 9/2005 | Collier et al. | |
| 2005/0260355 A1 | 11/2005 | Weber et al. | |
| 2006/0193026 A1* | 8/2006 | Nagamura et al. | 359/237 |
| 2006/0233694 A1 | 10/2006 | Sandhu et al. | |
| 2007/0003471 A1 | 1/2007 | Kawabata | |
| 2007/0090489 A1 | 4/2007 | Hart et al. | |
| 2008/0169563 A1 | 7/2008 | Awano et al. | |
| 2008/0272299 A1 | 11/2008 | Jin et al. | |

FOREIGN PATENT DOCUMENTS

| | | |
|---|---|---|
| KR | 200208463 | 11/2002 |

OTHER PUBLICATIONS

Co-pending U.S. Appl. No. 11/669,037, filed Jan. 30, 2007.
Co-pending U.S. Appl. No. 12/548,400, filed Aug. 26, 2009.
Co-pending U.S. Appl. No. 12/606,143, filed Oct. 26, 2009.
Delzeit et al., *"Growth of Carbon Nanotubes by Thermal and Plasma Chemical Vapor Deposition Processes and Applications in Microscopy,"* Nanotechnology 2002, 13:280-284.
Final Office Action dated May 29, 2009, in Co-Pending U.S. Appl. No. 11/669,037, filed Jan. 30, 2007.
International Search Report of PCT Application No. PCT/2008/052231, Dated May 22, 2008, pp. 1-3.
International Search Report of PCT Application No. PCT/2008/059841, Dated Oct. 14, 2008, pp. 1-3.
Non-Final Office Action dated Aug. 6, 2010, for Co-Pending U.S. Appl. No. 12/548,400, filed Aug. 26, 2009.
Non-Final Office Action dated Dec. 23, 2008, in Co-Pending U.S. Appl. No. 11/669,037, filed Jan. 30, 2007.
Non-Final Office Action dated Sep. 3, 2008, in Co-pending U.S. Appl. No. 11/240,173, filed Sep. 29, 2005.
Notice of Allowance dated Jul. 28, 2009, in Co-pending U.S. Appl. No. 11/240,173, filed Sep. 29, 2005.
Notice of Allowance dated Jun. 29, 2009, in Co-Pending U.S. Appl. No. 11/669,037, filed Jan. 30, 2007.
Oakley, William S., "E-Beam Hard Disk Drive Using Gated Carbon NanoTube Source and Phase Change Media" 24th IEEE Conference on Mass Storage Systems and Technologies, pp. 245-250; Sep. 24-27, 2007.
Onaran et al., "A New Atomic Force Microscope Probe with Force Sensing Integrated Readout and Active Tip", Review of Scientific Instruments 2006, Review of Scientific Instruments 2006, 77, 023501-1-023501-7.
Stevens et al., "Carbon Nanotubes as Probes for Atomic Force Microscopy", Nantechnology 2000, 11, pp. 1-5.
Stevens et al., "Improved Fabrication Approach for Carbon Nanotube Probe Devices", Appl. Phys. Lett. Nov. 2000, 77(21), pp. 3453-3455.
Written Opinion PCT Application No. PCT/2008/052231, Dated May 22, 2008, pp. 1-4.
Written Opinion PCT Application No. PCT/2008/059841, Dated Oct. 14, 2008, pp. 1-5.

* cited by examiner

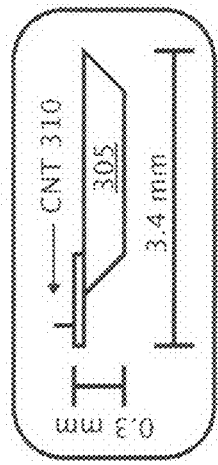
FIG. 3A
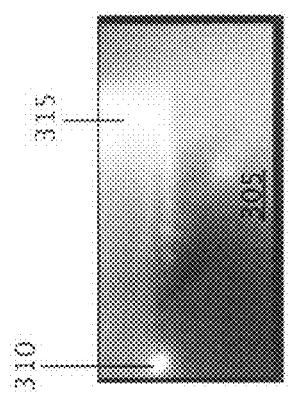
FIG. 3B
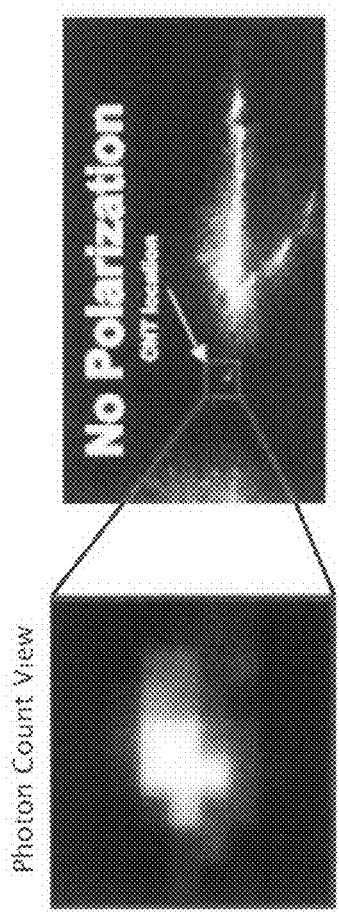
FIG. 3C
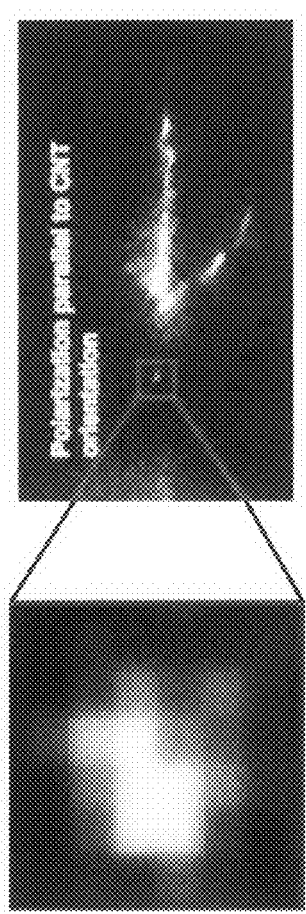
FIG. 3E
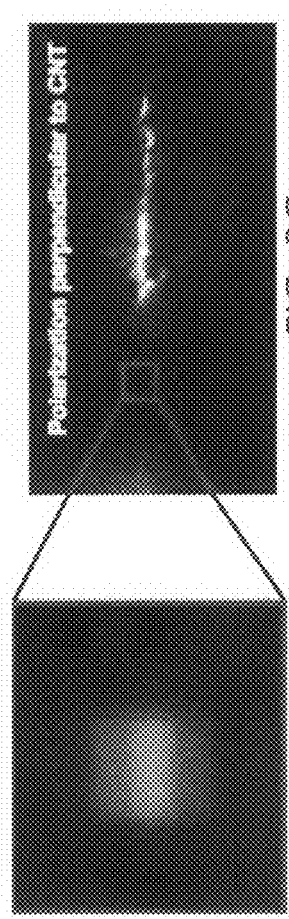
FIG. 3G
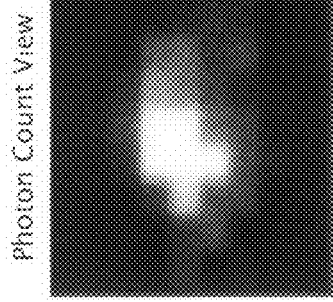
FIG. 3D
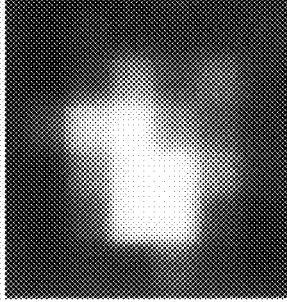
FIG. 3F
FIG. 3H $$\frac{1}{r}\frac{\delta}{\delta r}\left(r\frac{\delta}{\delta r}\right)+\frac{1}{r^2}\frac{\delta^2 \psi}{\delta \phi^2}\frac{a^2 \psi}{\delta z^2}+k^2\psi=0$$

$$\nabla^2 \psi + k^2 \psi = 0$$

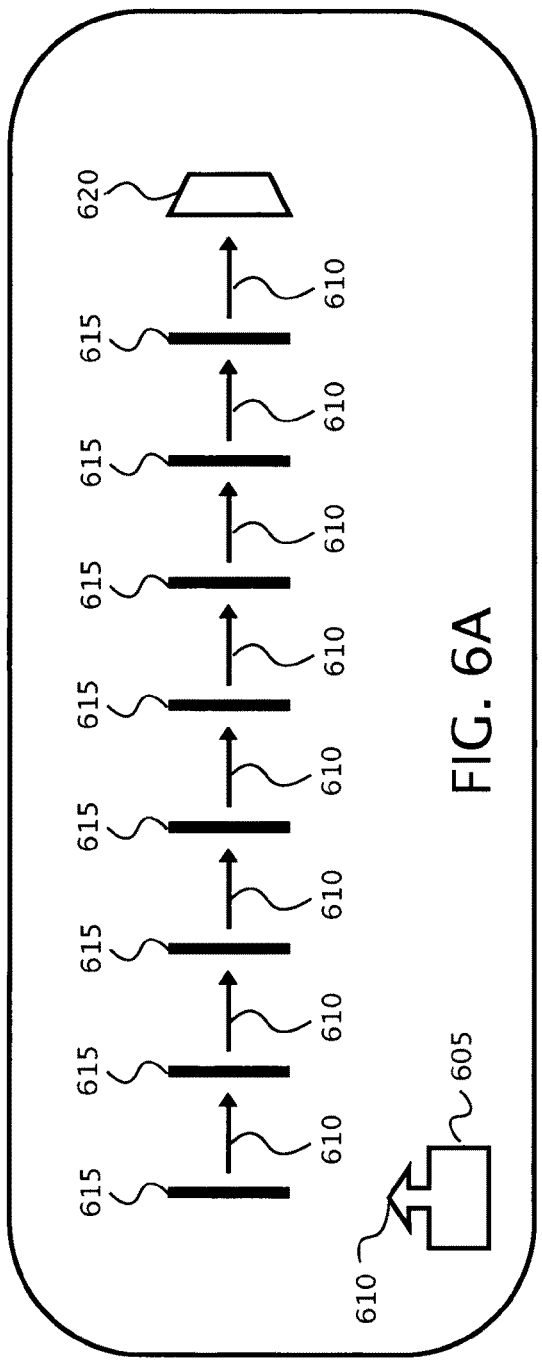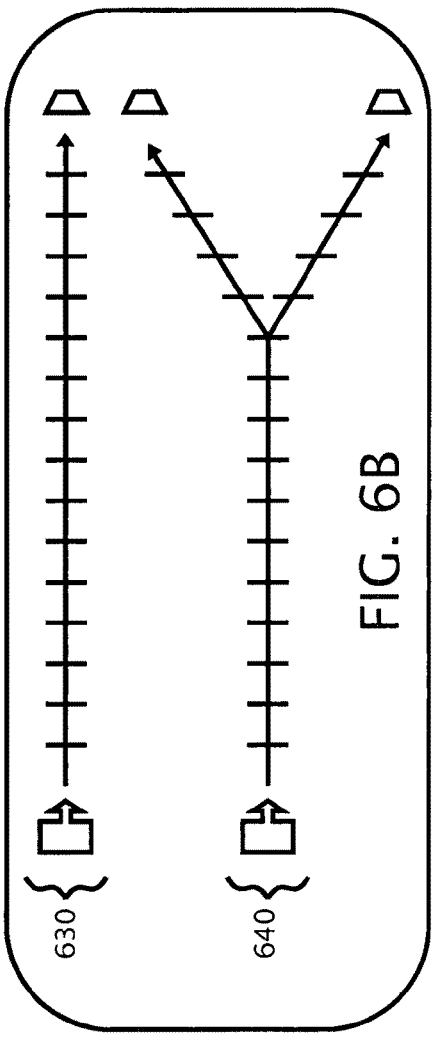

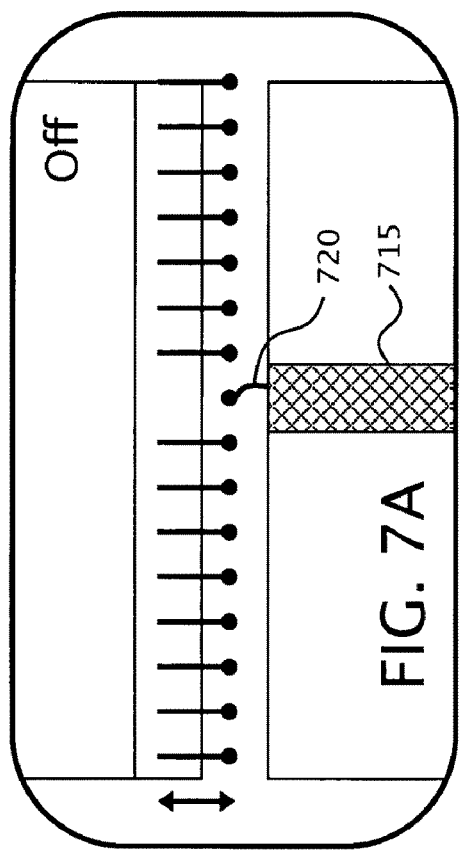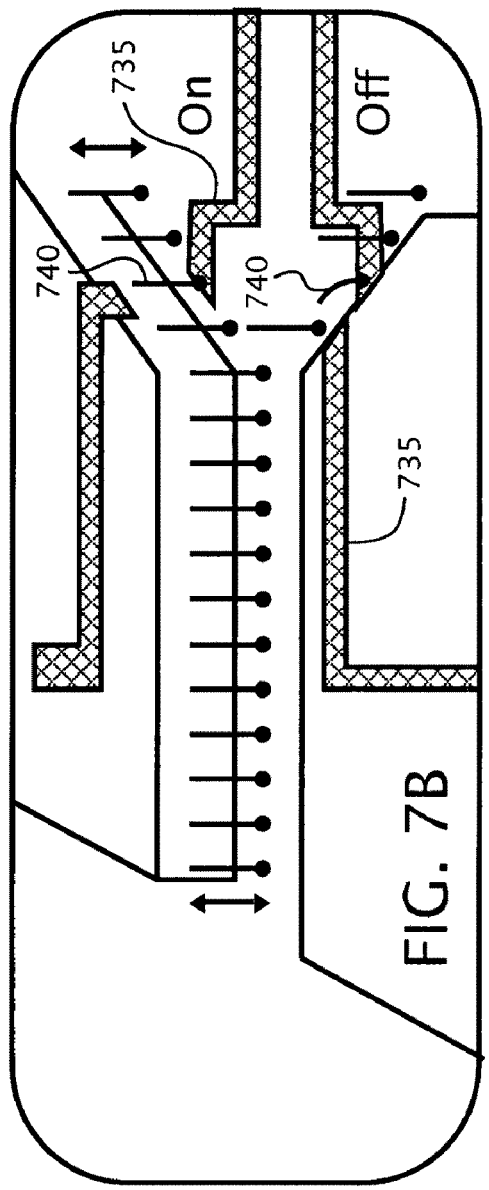

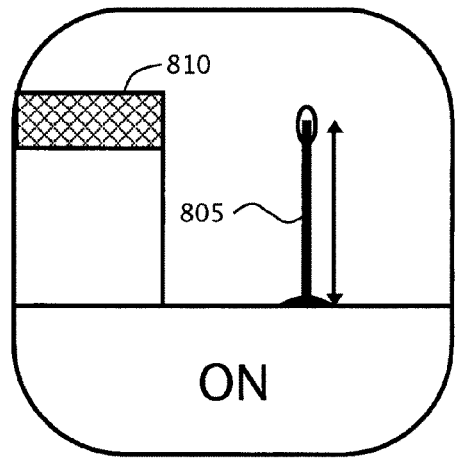
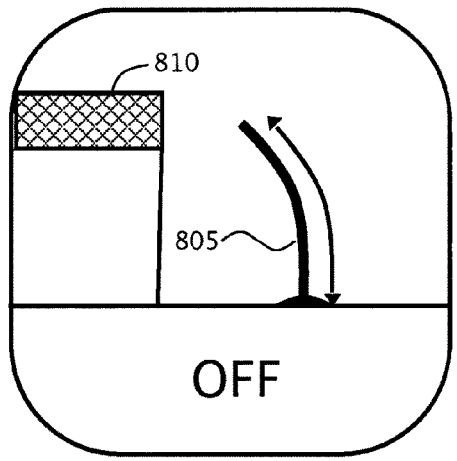
FIG. 8A  FIG. 8B
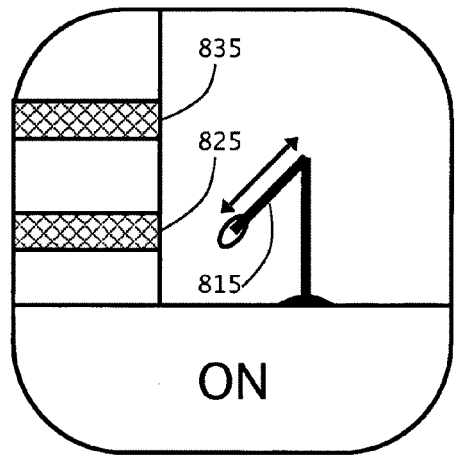
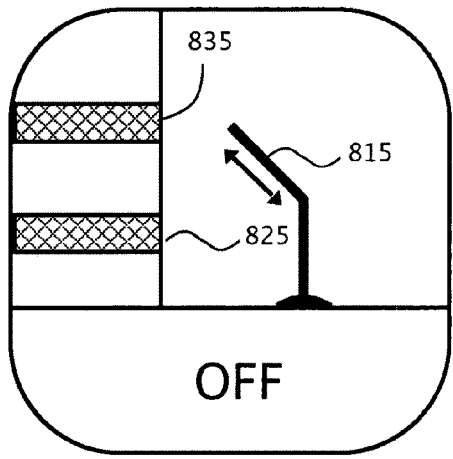
FIG. 8C  FIG. 8D

US 8,081,361 B2

CARBON NANOTUBE SIGNAL MODULATOR AND PHOTONIC TRANSMISSION DEVICE

BACKGROUND OF THE INVENTION

1. Field of the Invention

The invention pertains to a carbon nanotube signal modulator for reducing, eliminating, or enhancing the resonance interaction between photonic elements, and a photonic transmission device that may incorporate the signal modulator.

2. Description of Related Art

Electronic transistors are commonly fabricated on silicon wafers to make electronic computer chips and, unfortunately, have performance limitations that make them increasingly more expensive to manufacture to perform suitably as the performance requirements of computers increase. Photonic devices are under investigation as a potential solution to this problem—they are an advancement that takes advantage of the intrinsic properties of photons.

Photonic computing serves as an example application. Photonic computing uses photons of laser light instead of electrons as the basis for the computing element. As a result of ongoing efforts in this field, the art of computing has been working towards the development of a photonic signal modulator or "switch" that could be used as the basis for a photonic computing device. Some work has been focused on the development of a non-linear crystal capable of, for example, on/off modulation of a beam of photons. U.S. Pat. No. 5,093,802 teaches, for example, an optical computing method that uses interference patterns. And, a non-linear optics approach has also been investigated in order to make use of the optical properties of certain crystalline materials and modify the relative speed of the light. Existing electro-optical technologies, such as micro-electro-mechanical systems (MEMS), use tiny mechanical parts such as mirrors and thermo-optics technology derived from ink-jet technologies. These technologies have been used to create bubbles that can deflect light. Unfortunately, each of these attempts at producing a photonic signal modulator has uncovered problems that limit its use.

Synthesis of nanomaterials and construction of sophisticated nanodevices has uncovered physical phenomena and created opportunities in several technical areas. For example, a phenomenon of nanotechnology is that vibrational and electromagnetic (EM) frequencies can be substantially higher in the nano domain and, as a result, can be useful in communications and sensing applications. As device feature sizes decrease and bandwidth density pressure increases, nanomaterials and their associated wavelengths and resonant frequencies appear to have become increasingly more important. In turn, the extension of RF technology and practices into higher frequencies and smaller scales requires developing, for example, novel diode technology, as well as non-linear electronic elements that are capable of operating through harmonic interaction, amplification, and modulation at elevated speeds and efficiencies in the higher frequency ranges.

The physical dimensions and electron mobility associated with carbon nanotubes (CNTs) provide us with materials having properties that make them attractive for use in electronic devices that operate in the optical domain. For example, the integration of CNTs into conductive polymeric thin films and densely packed CNT arrays have produced a classical antenna-like response to incident light. See Wang et al., App. Phys. Lett (2004). In these nanotube "forest" arrays, the CNTs can be grown (i) vertically aligned to produce a "polarization effect" relating to their alignment and (ii) to the same length to produce a "length effect" and consequent "resonance" interaction.

The teachings provided herein represent an improvement over the current state-of-the-art. One of skill will appreciate that the only relevant experiments with CNTs have thus far have been limited to bulk CNT samples having largely overlapping field geometries, such that the performance of oriented CNT arrays has not been appreciated. Most importantly, however, the art will benefit highly from a functioning CNT signal modulator that is capable of reducing or eliminating the resonance interaction of photons within a CNT array.

SUMMARY OF THE INVENTION

The embodiments taught herein generally pertain to a carbon nanotube signal modulator for reducing, eliminating, or enhancing the resonance interaction between photonic elements, and a photonic transmission device that may incorporate the signal modulator. A variety of methods and techniques for fabricating a CNT signal modulator are contemplated.

The carbon nanotube (CNT) signal modulator comprises a gate CNT on a substrate in a position for (i) receiving an input photonic signal and an input modulation signal and (ii) transmitting an output photonic signal that is reduced, eliminated, or enhanced through the selection of the input modulation signal to provide a modulated output photonic signal; and an input modulation signal sender for sending the input modulation signal to the gate CNT and creating the modulated output photonic signal from the gate CNT. The input modulation signal comprises a photon or an electron, wherein the photon can have a predetermined phase alignment with the input photonic signal, and the phase alignment is selectable to reduce, eliminate, or enhance the modulated output photonic signal by affecting the resonance interaction of the photons at the gate CNT.

In some embodiments, the input modulation signal comprises an electron having a current that is controllable to reduce, eliminate, or enhance the modulated output photonic signal from the gate CNT, and in some embodiments, the input modulation signal can comprise an electron having a current that is controllable to change the orientation of the gate CNT on the substrate to reduce, eliminate, or enhance the modulated output photonic signal from the gate CNT. In some embodiments, the signal modulator is an on/off logic device and, in some embodiments, the signal modulator is a multi-gate logic device having multiple gate CNTs.

The input modulation signal sender and the CNT can be positioned on the same substrate and, in some embodiments, a portion of the CNT can be coated with a metal that enhances the output photonic signal. In these embodiments, the metal can include, for example, gold, silver, or platinum.

In some embodiments, the invention includes a process for creating the carbon nanotube (CNT) signal modulator. The process includes fabricating the gate CNT on the substrate in a position for (i) receiving the input photonic signal and the input modulation signal, wherein the input modulation signal comprises the photon or the electron; and (ii) transmitting the output photonic signal that is reduced, eliminated, or enhanced through the selection of the input modulation signal to provide the modulated output photonic signal; and positioning the input modulation signal sender for sending the input modulation signal to the gate CNT and creating the modulated output photonic signal. In some embodiments, the process includes positioning the input modulation signal sender on the same substrate as the gate CNT. In some embodiments, the fabricating includes coating a portion of the gate CNT with a metal that enhances the output photonic signal, and the metal can comprise, for example, gold, silver, or platinum.

The invention can also include a method of transmitting a modulated output photonic signal using the carbon nanotube (CNT) signal modulator. The method can include sending the input photonic signal to the gate CNT; sending the input modulation signal to the gate CNT to create the modulated output photonic signal, wherein the input modulation signal comprises the photon or the electron; and transmitting the modulated output photonic signal.

In some embodiments, the invention can include a photonic transmission device and a process for creating a photonic transmission device. The process can comprise fabricating a plurality of CNTs, each having functional antenna forms that are capable of a resonance interaction of photons between adjacent CNTs when formed as an array on a substrate; and forming the array of CNTs on the substrate, wherein each CNT in the array has (i) a substantially parallel orientation to the adjacent CNTs and (ii) a diameter and length suitable to allow for the resonance interaction of the photons between adjacent CNTs in the array. The photonic transmission device can include the CNT signal modulator as a gate CNT within the plurality of CNTs for transmitting the modulated output photonic signal.

BRIEF DESCRIPTION OF THE DRAWINGS

FIGS. 2A and 2B illustrate a CNT before and after IBM (ion beam molding) processing according to some embodiments of the present invention.

FIGS. 3A through 3H illustrate the polarization dependence of light emitted from a CNT following re-emission of an incident light according to some embodiments.

FIGS. 6A and 6B show a photo-transmission line according to some embodiments.

FIGS. 7A and 7B show how logic gates can be designed and function according to some embodiments.

FIGS. 8A through 8D show how a variety of photonic on/off switch configurations can be designed according to some embodiments.

DETAILED DESCRIPTION OF THE INVENTION

Generally speaking, the embodiments taught herein pertain to a carbon nanotube signal modulator for reducing, eliminating, or enhancing the resonance interaction between photonic elements, and a photonic transmission device that may incorporate the signal modulator. A variety of methods and techniques for fabricating a CNT signal modulator have been taught in the embodiments provided.

Since a photon can be absorbed and re-emitted by a single CNT or an array of CNTs, this principle can be used to create a CNT signal modulator, as well as a photonic transmission device. The photons that can be absorbed or emitted by a nanotube are polarized because the electrons in the nanotube are constrained to the physical dimensions of the carbon nanotube. The extremely high ratio of length to width of CNTs substantially favors the movement of electrons within CNTs to along the lengthwise direction when illuminated with light of the appropriate wavelength. This restricted movement creates a specific polarization orientation for photons that is parallel to the orientation of the CNT. If the physical orientation of two CNTs is parallel, the CNTs can interact with each other electromagnetically, and the strength of the electromagnetic interaction can be controlled by controlling the degree of alignment of the CNTs, which controls the corresponding difference in polarization.

In some embodiments, the teachings herein can be used to create an on/off photonic signal modulation by changing the orientation and polarization of two interacting CNT photonic elements. In some embodiments, the orientation of the CNT can be changed by locating the CNT on a movable MEMS device or by bending the CNT mechanically or electromagnetically. In some embodiments, the orientation can be selected to reduce the transmitted signal by a desired amount, making the signal modulation of the CNT element an adjustable signal modulation.

In some embodiments, the signal modulation can include an adjustable signal modulation function based on photon path length differences, or other mechanism such as timing, to result in two photons having different phases that can interfere with one-another and reduce or eliminate the signal transmission. In these embodiments, photons of opposite phase can strike the same CNT simultaneously, thus causing cessation of the signal. Likewise, the phases can be the same and thus reinforce one-another to amplify the signal. It should be appreciated that the modulation can be limited to only reducing the signal, only eliminating the signal, or only enhancing signal, in some embodiments, depending on the desired application.

Figure 1:
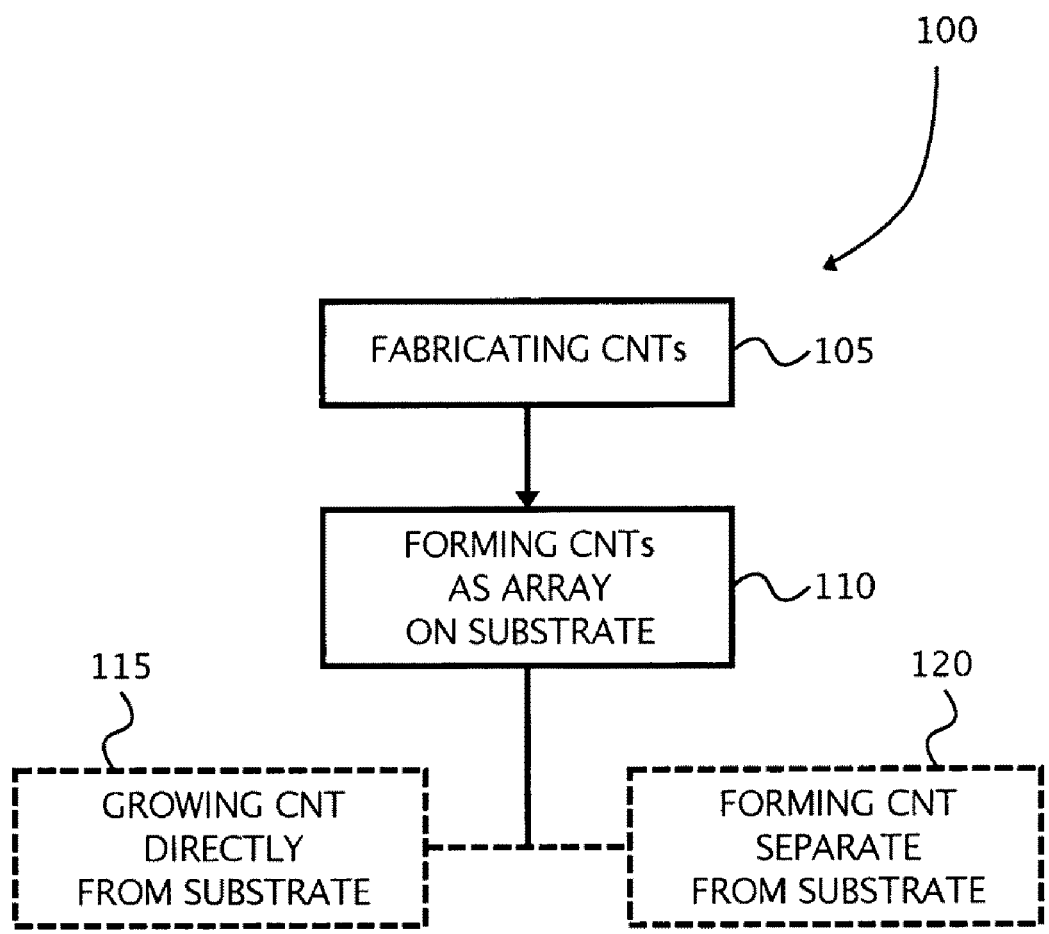
FIG. 1 is a flowchart showing the basic principles of forming the CNT signal modulators according to some embodiments.

FIG. 1 is a flowchart showing the basic principles of forming the CNT signal modulators according to some embodiments. The process 100 includes fabricating 105 a plurality of CNTs, where each in the plurality can have a functional antenna form that is capable of a resonance interaction of photons between adjacent CNTs when the CNTs are formed 110 as an oriented array on a substrate. One of skill will appreciate that the CNTs can be grown directly 115 from the substrate or formed separate 120 from the substrate. The CNTs formed separate 115 from the substrate can be attached to the substrate, where attachment of the plurality forms a desired array of CNTs on the substrate. The CNTs grown directly 115 from the substrate can be grown in the form of the desired array.

Those skilled in the art can produce CNTs using any known method. For example, CNTs can be produced using plasma-enhanced chemical vapor deposition (PECVD). In some embodiments, a Si substrate can be coated with a thin film of Ni catalyst (about 20 nm) in a dc magnetron sputtering system and then heated to about 550-600° C. in a PECVD reaction chamber to break up the Ni film into small catalyst particles. A gas mixture of $NH_3$ and $C_2H_2$ can be introduced into the PECVD chamber at a ratio of 2:1, and a dc glow discharge plasma can then be generated and maintained by a bias voltage of about 500-550V. A growth time of about 1 to 2 minutes should yield nanotubes of about 1000 nm or less.

In some embodiments, the primary growth conditions include thermal chemical vapor deposition at 750° C., use of an ethylene feed gas, and an iron catalyst, as shown by the accompanying example. The growth time can be about 5 minutes and can yield a higher quality nanotube than the method described above.

In some embodiments, the CNTs can range in size from about 1 nm to about 300 nm in diameter. In some embodiments, the CNTs can range in size from about 25 nm to about 75 nm in diameter, from about 20 nm to about 80 nm in diameter, from about 30 nm to about 70 nm in diameter, from about 35 nm to about 65 nm in diameter, from about 40 nm to about 60 nm in diameter, or any range therein. In some embodiments, the CNTs range from about 10 nm to about 1 mm, from about 100 nm to about $10^5$ nm, from about 200 nm to about $10^4$ nm, from about 400 nm to about 1000 nm, from about 400 nm to about 700 nm, from about 700 nm to about 1000 nm, from about 700 nm to about 1500 nm, from about 1500 nm to about 2500 nm, from about 2500 nm to about 3000 nm, or any range therein, in length. One of skill will appreciate that the antenna effect of a CNT can be enhanced when the length of the antenna is a multiple of the refractive-index-adjusted half-wavelength of the electromagnetic radiation.

In some embodiments, the CNTs can also be coated with a material, or embedded in a material, that can modify the properties of the CNT and/or provide an enhanced or additional functionality. Metals like gold and silver, for example, have been shown to have desirable photonic properties. In some embodiments, the CNTs can be coated with a polymer, a photon-active semiconducting material, a dielectric, or a monomeric or oligomeric chemical moiety. The CNT can act as the photonic element itself or can serve as a scaffold or support substrate to allow the active polymer, chemical, or metal to be in the desired shape, position, and orientation to enable various photonic applications.

In many embodiments, each CNT in the array can have (i) a substantially parallel orientation to the adjacent CNTs and (ii) a diameter and length suitable to allow for the resonance interaction of the photons between adjacent CNTs in the array. And, the process includes providing a means to change the orientation of a CNT in the array. Any means known to one of skill can be used, as long as it is a switching mechanism for changing the orientation of a gate CNT in the array to reduce or eliminate the resonance interaction of photons at the position of the gate CNT and enabling signal modulation. In some embodiments, the signal modulator is an on/off logic device. In some embodiments, the signal modulator is a multi-gate logic device. In some embodiments, a "substantially parallel" orientation of CNTs can be one that provides for at least 99.5%, 99%, 97%, 95%, 90%, 85%, 80%, or 75% transmission of an energy signal from the second CNT in the substantially parallel oriented CNTs, as compared to the transmission of the same energy signal realized through a truly parallel orientation of the CNTs. It should be appreciated that the required limitation of what is "substantially parallel" can vary, depending on the embodiment, as the system requirements can vary according to, for example, the use intended for the apparatus and the allowable variation in performance.

In some embodiments, the switching mechanism comprises an electromagnetic component. In some embodiments, the switching mechanism comprises a mechanical component. In some embodiments, the switching mechanism comprises a photon phase modulator component to create an out-of-phase photon to strike the gate CNT at the same time as a resonance photon and reduce or eliminate the resonance interaction of photons at the gate CNT.

Any electromagnetic energy capable of transmission through the CNTs can be used. In some embodiments, the energy can be selected from a group consisting of radiowave, microwave, infrared, optical, and ultraviolet. In some embodiments, the photons have a wavelength ranging from about 10 nm to about 1 mm, from about 100 nm to about $10^5$ nm, from about 200 nm to about $10^4$ nm, from about 400 nm to about 1000 nm, or any range therein. In some embodiments, the photons have a wavelength ranging from about 400 nm to about 700 nm, from about 700 nm to about 1000 nm, from about 700 nm to about 1500 nm, from about 1500 nm to about 2500 nm, from about 2500 nm to about 3000 nm, or any range therein.

In some embodiments, the CNT signal modulator can include a gate CNT on a substrate in a position for receiving an input photonic signal and an input modulation signal and transmitting an output photonic signal that is reduced, eliminated, or enhanced through the selection of the input modulation signal to provide a modulated output photonic signal. The input modulation signal can comprise a photon or an electron. The CNT signal modulator can also include an input modulation signal sender for sending the input modulation signal to the gate CNT and creating the modulated output photonic signal from the gate CNT.

A process for creating the CNT signal modulator can include fabricating the gate CNT on the substrate in a position for (i) receiving the input photonic signal and the input modulation signal, wherein the input modulation signal comprises the photon or the electron; and (ii) transmitting the output photonic signal that is reduced, eliminated, or enhanced through the selection of the input modulation signal to provide the modulated output photonic signal. An input modulation signal sender is positioned for sending the input modulation signal to the gate CNT and creating the modulated output photonic signal. The input modulation signal sender can be any source of electrons or photons known to one of skill to be useful in any particular application. In some embodiments, the input modulation signal sender can include a photonic element and, in some embodiments, the process includes positioning the input modulation signal sender on the same substrate as the gate CNT.

In some embodiments, the photonic element can include, for example, a laser, a modulator, a photodiode, a VCSEL, a distributed feedback laser diode, an optical fiber, a lens, a diffractive lens, an optical lens, a spherical lens, an aspherical lens, a ball lens, a GRIN lens, a lens system, a flat mirror, a shaped mirror, a diffractive mirror, a prism, a hologram, a wave guide, a slab waveguide, a planar wave guide, a photonic crystal wave guide, a grating plate, an arrayed waveguide grating, a diffraction grating, a diffraction wave guide grating, crossbar switches, y-branches, directional couplers, a Fabry-Perot interferometer, or a Mach-Zehnder interferometer.

The fabricating can include coating a portion of the gate CNT with a metal that enhances the output photonic signal. In some embodiments, the metal can include gold, silver, or platinum. Nanoscale-sized metals can be used to coat the CNT to enhance the photonic interaction of the CNT, wherein the nanoscale metal can serve as a photonic oscillator.

The input modulation signal can comprise a photon having a predetermined phase alignment with the input photonic signal. In some embodiments, the phase alignment can be a variable selected to reduce, eliminate, or enhance the modulated output photonic signal by affecting the resonance interaction of the photons at the gate CNT. An out of phase photon can reduce or eliminate an output signal, whereas an in-phase photon can enhance an output signal.

In some embodiments, the input modulation signal can comprise an electron having a current that can be controllable to reduce, eliminate, or enhance the modulated output photonic signal from the gate CNT. One of skill will understand that known electronic techniques can be used to control electron flow and, thus, reduce, eliminate, or even enhance the output photonic signal.

In some embodiments, the input modulation signal can comprise an electron having a current that can be controllable to change the orientation of the gate CNT on the substrate to reduce, eliminate, or enhance the modulated output photonic signal from the gate CNT. One of skill will appreciate that known electronic techniques can be used to change the orientation of the gate CNT using electromechanical means. For example, by deviating from parallel orientation, the output photonic signal can be reduced or eliminated, whereas by changing the distance between parallel oriented CNTs, the signal can be reduced, eliminated, or even enhanced. In some embodiments, the signal modulator is an on/off logic device and, in some embodiments, the signal modulator is a multi-gate logic device having multiple gate CNTs.

The signal modulator can be designed for photons having almost any known and useful wavelength, such as a wavelength ranging from about 400 nm to about 700 nm. In some embodiments, the signal modulator is designed for photons having a wavelength ranging from about 700 nm to about 1000 nm, from about 700 to about 1500 nm, from about 1500 nm to about 2500 nm, from about 2500 nm to about 3000 nm, or any range therein.

One of skill will appreciate that the teachings herein can be applied to a wide variety of applications. In some embodiments, for example, nanodevices can be used as chemical or biological sensors, wherein a nanotube antenna can be used to couple such nanosensors in the manner taught herein. In these embodiments, for example, a photonic and electronic coupling between a CNT signal modulator and a sample of interest supplies data as to the qualities of the sample. In some embodiments, one of the nanosensors can provide the photonic interaction antenna effect, and another can be perhaps functionalized and coupled to the "antenna" to provide a sensitivity and/or a frequency shift detection to enable chemical or biological detection measurements. In addition, the teachings presented herein can be combined with a basic understanding of nanoscale electromagnetic interactions to provide for the development of photonic computing, future communications applications, nanowaveguides, nanooptosensors, wireless interconnects to nanodevices, visible light nanoantennas, efficient solar energy devices, beamed power transducers, and the like.

EXAMPLE 1

Controlled Manufacture of CNTs

The ability to manipulate nanomaterials in a controllable manner is needed for many nanotechnology applications. As-grown CNTs, for example, do not always exhibit the desired shape and configuration ideal for a given application but require further manipulation to render them suitable. In nanotransistors, the bends and kinks along the length of a CNT can change the bandgap of the CNT, thus altering its behavior. Modus Nanotechnology has fabricated multiple CNT nanoantenna geometries and orientations having lengths suitable for resonant interaction with photon wavelengths that range, for example, from the optical regime to the infrared. CNTs formed into functional geometries can perform as the functional element in a photonic device or as a nanoantenna.

Figure 2B:
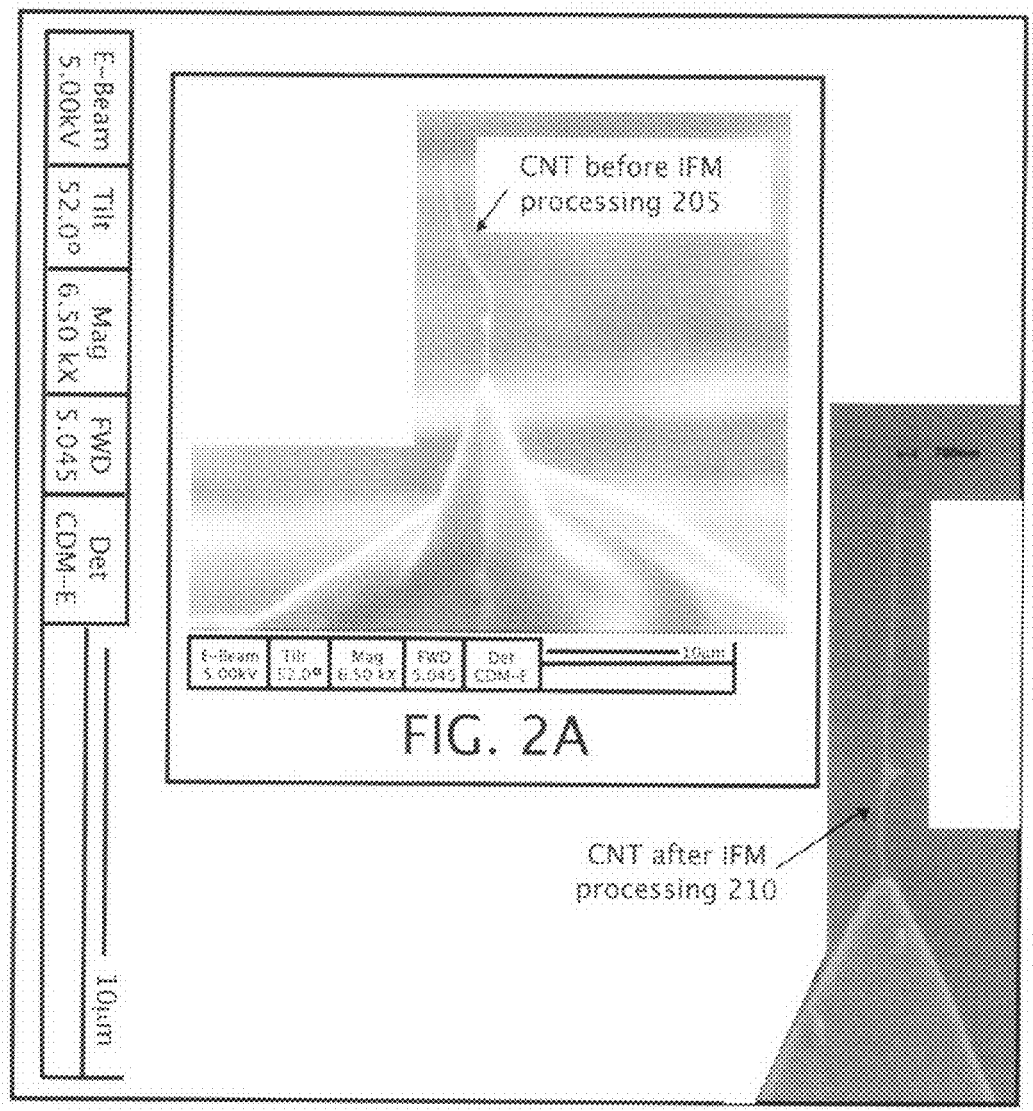

IBM (ion beam molding) can be used to create functional nanoantenna geometries. FIGS. 2A and 2B illustrate a CNT before and after IBM according to some embodiments of the present invention. In FIG. 2A, a CNT displays its "as-grown" native curvature 205 before IBM. In FIG. 2B, it can be seen that IBM can be used to create a CNT having a bend length 210 of about 700 nm, which is in the optical wavelength range.

The demonstration of the IBM technique for nanomanipulation includes the use of an atomic force microscope (AFM) as the platform and a carbon nanotube as the nanomaterial. The CNT is attached to the apex of the tip of the AFM for this purpose. A multiwalled carbon nanotube (MWNT) probe was fabricated using a chemical-vapor deposition (CVD) process on a Pt/Ir wire that is 1 cm long and 1 mm in diameter. The wire was first immersed in an iron-containing solution and then placed in a CVD chamber under ethylene flow at 750° C. Within a short period of time, the MWNTs appeared in the Pt/Ir wire. From the bunch of CNTs, a single nanotube was transferred to the AFM probe assembly. In some embodiments, the CNT can be grown on the AFM probe directly.

For nanomanipulation, the probe assembly with the nanotube was inserted into a dual beam focused ion beam (FIB) instrument (Accurel, Sunnyvale, Calif.), which has both an electron beam and an ion beam. The scanning electron microscope (SEM) function using the electron beam was used to locate the area of interest containing the nanotube. FIBs, normally used for milling applications, are designed with the ability to know the distance and angles between the beam and sample. The sample is on a sample plate with rotation and X, Y, and Z translation, and the angle of the beam with respect to the sample plate is user defined. The angle can be set using these mechanism within the precision of the instrument's positional accuracy. The angle and Z direction of the ion beam needs to be defined with respect to the nanotube's location and the desired direction/orientation of the final configuration. The nanotube was then exposed to a gallium ion beam that raster-scanned a 5 micron region containing the nanotube from a prescribed angle at 50 pA beam current for 5 seconds or less. An increase in energy can shorten the process even further, but only up to a point.

EXAMPLE 2

CNT Nanoantennas

The performance metrics of the nanoantennas were tested and the results showed that CNTs fabricated into functional antenna forms, demonstrate photonic properties and antenna efficiencies comparable to theoretical values. Measured polarization proved dependent upon the orientation of the CNT and this property can lead to functional carbon nanotube based photonic logic device elements.

A nanotube acts as an antenna re-radiating light with an electric field E, polarized in the plane parallel to the CNT. A polarizer, with its axis of polarization rotated by an angle θ to this plane, transmits radiation with a projected electric field $E'=E \cos \theta$, and the corresponding observed intensity is given by the law of Malus $I_{NT} = \propto (E')^2 = E^2 \cos\theta$. A general equation describing the scattering maxima from a random array of dipole antennas is:

$$L = m\left(\frac{\lambda}{2}\right) f(\theta, n)$$

where L is the scattered light, m is the ratio of the speed of electromagnetic propagation in the antenna to that in a vacuum, and $f(\theta,n)=1$ for a single, simple dipole illuminated at normal incidence.

A scattered light background signal is established by measuring the scattered light from test substrates of various materials including Si and SiO2 and thin metal films. These results are compared with measurements from the variable geometry CNT samples. The attenuation cross section of the EM radiation is estimated to be comparable to the physical dimensions of the nanoantennas. A measurement of the effective aperture is approximated and compared with theoretical values.

FIGS. 3A through 3H illustrate the polarization dependence of light emitted from a CNT following re-emission of an incident light according to some embodiments. FIG. 3A shows a schematic of an Si substrate 305 and a CNT 310 attached to the surface of the Si substrate 305. FIG. 3B shows a backlit view of the Si substrate 305 and the attached CNT 310 of FIG. 3A, where the CNT is cantilever re-radiating an incident broad spectrum light 315.

In FIG. 3C, the incident light is not polarized, the emitted light has the photon count shown in FIG. 3D. In FIG. 3E, the incident light is polarized parallel to the CNT orientation, and the photon count shown in FIG. 3F compares to the photon count in FIG. 3D. In contrast, the incident light in FIG. 3G is polarized perpendicular to the orientation of the CNT, and the photon count shown in FIG. 3H is eliminated. Accordingly, the data shows a strong polarization relationship between the incident light and the light emitted from a CNT.

EXAMPLE 3

Measured Efficiency and Polarization Dependence of a CNT Nanoantenna

Example 2 shows the polarization relationship between the incident light and the light emitted from an oriented CNT. Since the polarized light must be coming from the CNT only, the emission data can be used to calculate the efficiency of a CNT nanoantenna. The E fields scattered by a cylinder can be expressed in a concise manner by resolving the incident and scattered fields into perpendicular and parallel components and consider the fields at large distances compared to its wavelength.

Figure 4:
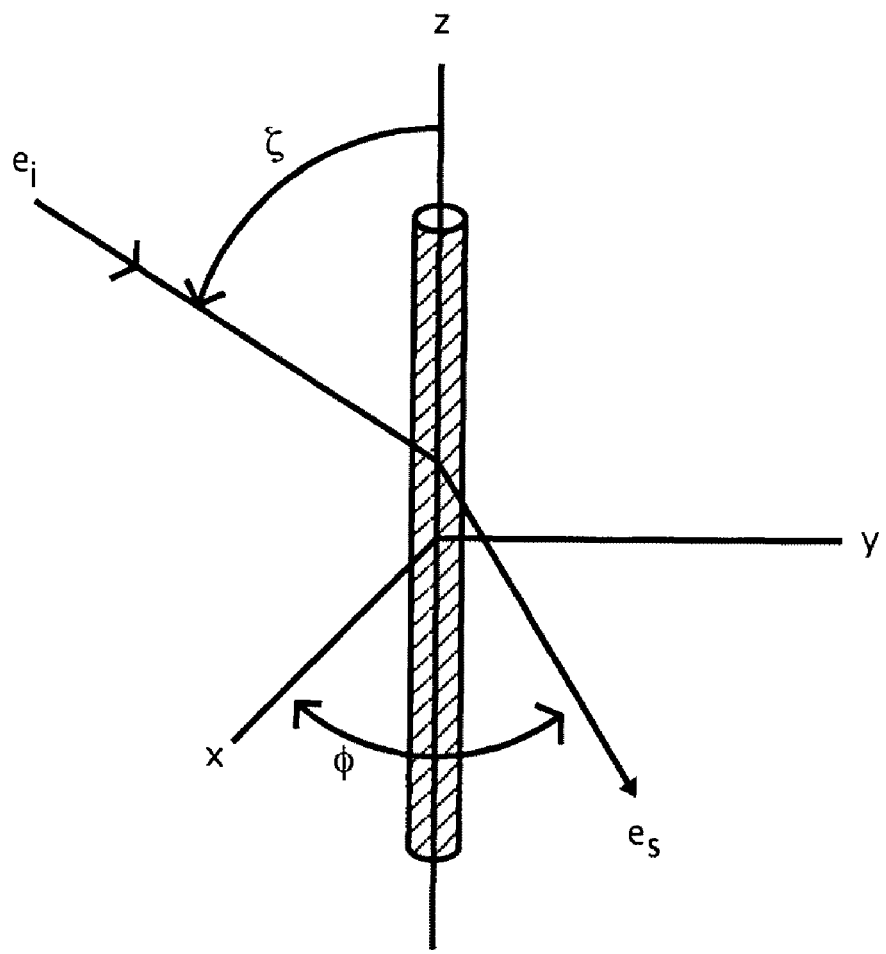
FIG. 4 illustrates polarization considerations for a CNT nanoantenna according to some embodiments.

FIG. 4 illustrates polarization considerations for a CNT nanoantenna according to some embodiments. For unpolarized light incident on the cylinder axis, the scattered field, polarized parallel and perpendicular to the axis can be expressed in terms of the incident fields through the following matrix equation.

$$\begin{pmatrix} E_{\parallel}^s \\ E_{\perp}^s \end{pmatrix} = e^{i3\pi} \sqrt{\frac{2\chi_t}{\Omega \sin\zeta}} e^{ik(r\sin\zeta - z\cos\zeta)} \begin{pmatrix} T_1 & T_4 \\ T_3 & T_2 \end{pmatrix} \begin{pmatrix} E_{\parallel}^i \\ E_{\perp}^i \end{pmatrix}$$

where $\chi$ and $\Omega$ are apparatus efficiency and scattering solid angle, respectively, T is the transfer matrix and the angles are as shown in the figure.

The matrix relationship can be simplified where the diameter of the cylinder is small compared to the wavelength, and the incident light arrives normal to the cylinder axis. In this case, $T_1 = b_0$, $T_2 = a_0$, $T_3 = 2ia_1\sin\phi$ and $T_4 = -2ib_1\sin\phi$, and $\sin\zeta$ is unity.

$$b_0 = a_1 = \frac{-i\pi}{4}\left(\frac{2\pi r}{\lambda}\right)^2 (m^2 - 1)$$

$$a_0 = b_1 = \frac{-i\pi}{32}\left(\frac{2\pi r}{\lambda}\right)^4 (m^2 - 1)$$

For viewing normal to the wire axis, $\sin\phi = 0$. The intensity of the scattered light is the square of the scattered E fields giving, $$I_{\parallel}^s = |E_{\parallel}^s|^2 = \frac{2\chi_t}{\Omega}(b_0^2 I_{\parallel}^i)$$

$$I_{\perp}^s = |E_{\perp}^s|^2 = \frac{2\chi_t}{\Omega}(a_0^2 I_{\perp}^i)$$

where the scattering solid angle is given by $2\pi$ times the azimuthal diffraction angle given by the finite focal width of the illuminating laser.

Our F/2 viewing system provides a collection solid angle and, from this, we have estimated an optical throughput efficiency of ~10%, including both the input and output lenses, combined with the detector efficiency. Evaluating $a_0$ and $b_0$, the carbon nanotube diameter is 40 nm and the illuminating laser wavelength is 514 nm. The complex refractive index, m, for the nested nanotubes is not known so we base our estimations on the measured graphite values. Combining these factors we can estimate the scattering efficiency and compare that to our measured values.

For parallel polarization, we estimate an intrinsic scattering efficiency/solid angle of about 15% of the parallel incident light that is intercepted by the nanotube. The geometric intercept fraction is ~2.5%, giving an overall scattering fraction of $4e^{-4}$ of $I_{\parallel}$. We collect about ¼ of this in our F/2 lens.

For the illumination conditions of our experiment, this translates into an expected photon count per pulse of $1e^6$ photons. Integrating the scatter spot we measure ~$3e^5$ photons, which we believe to be in good agreement with our expectations. Comparing parallel with perpendicular polarization we expect a ratio for unpolarized light to be given by $$\frac{I_{\perp}^s}{I_{\parallel}^s} = \left(\frac{a_0}{b_0}\right)^2 = \left(\frac{2\pi r}{\lambda}\right)^4$$

Our measured ratio is ~0.09, and our theoretical estimate is 0.057. Accordingly, this measured efficiency and polarization dependence of a CNT nanoantenna demonstrates that CNTs can function in photonic and nanoantenna applications.

EXAMPLE 4

Photonic Transmission Device Configurations

Various device architecture configurations can be used to take advantage of CNT photonic properties. An electromagnetic field can be used, for example, to change the orientation of a select CNT, which can be referred to in some embodiments as a gate CNT.

Figure 5A:
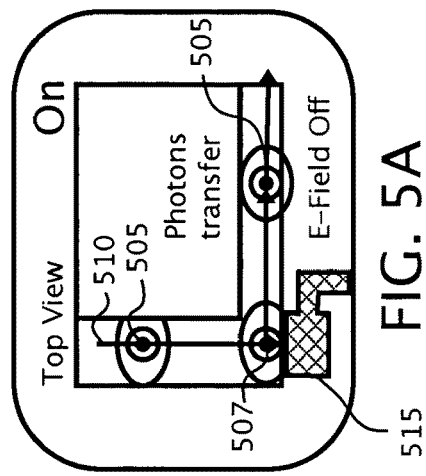
FIGS. 5A through 5D show polarization-dependent photon transfer that results in on/off signal transduction according to some embodiments.
Figure 5B:
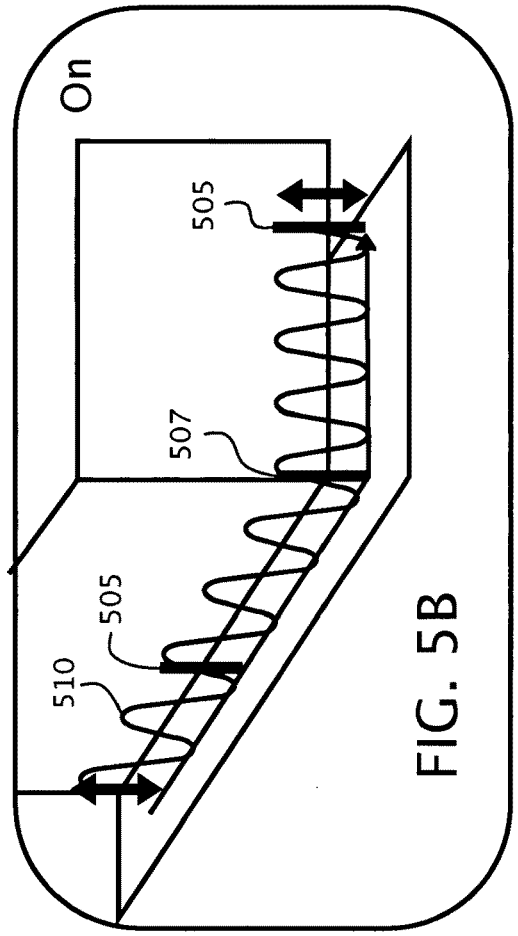
Figure 5C:
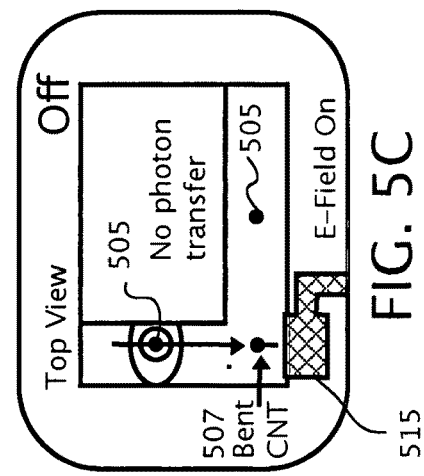
Figure 5D:
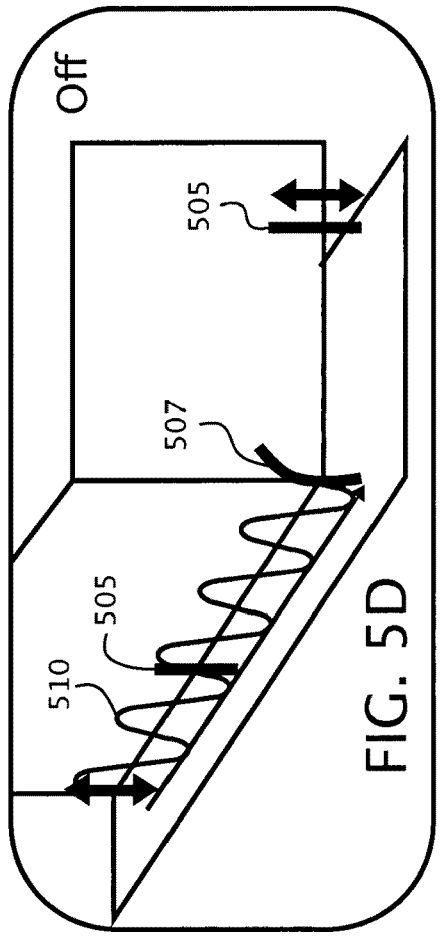

FIGS. 5A through 5D show polarization-dependent photon transfer that results in on/off signal transduction according to some embodiments. In FIG. 5A, the CNTs 505, 507 remain aligned due to the absence of an electromagnetic field, such that the photons 510 transfer through the aligned CNTs 505, 507. FIG. 5B further illustrates this concept, where the photons 510 are shown to transfer through the aligned CNTs 505, 507. In FIG. 5C, the CNTs 505, 507 are no longer aligned due to the application of an electromagnetic field 515, such that the photons 510 cannot pass through the gate CNT 507. FIG. 5D further illustrates this concept, where the photons 510 are shown to stop at the misaligned gate CNT 507. Accordingly, the polarization dependent photon transfer allows for an on/off signal transduction.

FIGS. 6A and 6B show a photo-transmission line according to some embodiments. In FIG. 6A, the photon source 605 provides incident energy 610 to the aligned array of CNTs 615, and the aligned array of CNTs 615 transmit the energy 610 to the detector/transducer 620. FIG. 6B illustrates how the photo-transmission line can have a variety of configurations, such as a straight-line configuration 630 or a Y-junction configuration 640. As such, the resonant energy storage effect of the CNT arrays allows for efficient photon transfer throughout transmission lines which can be used in a variety of applications that include, for example, communications and computing applications.

Essentially, these transmission lines serve as logic gates. FIGS. 7A and 7B show how logic gates can be designed and function according to some embodiments. FIG. 7A shows a straight-line configuration 705, where the gate CNT 720 is pulled out of orientation with an electromagnetic force 715. Likewise, FIG. 7B shows how a Y-junction 730 configuration can be used to select a pathway for the signal using an electromagnetic force 735 to pull the gate CNT 740 out of alignment.

FIGS. 8A through 8D show how a variety of photonic on/off switch configurations can be designed according to some embodiments. FIGS. 8A and 8B show the vertically oriented gate CNT 805 that is pulled out of orientation using an electromagnetic force 810, whereas FIGS. 8C and 8D show that the desired CNT "on" alignment may be fixed by orienting the gate CNT 815 using a first electromagnetic force 825 and the "off" alignment may likewise by selected using a second electromagnetic force 835.

Figure 9A:
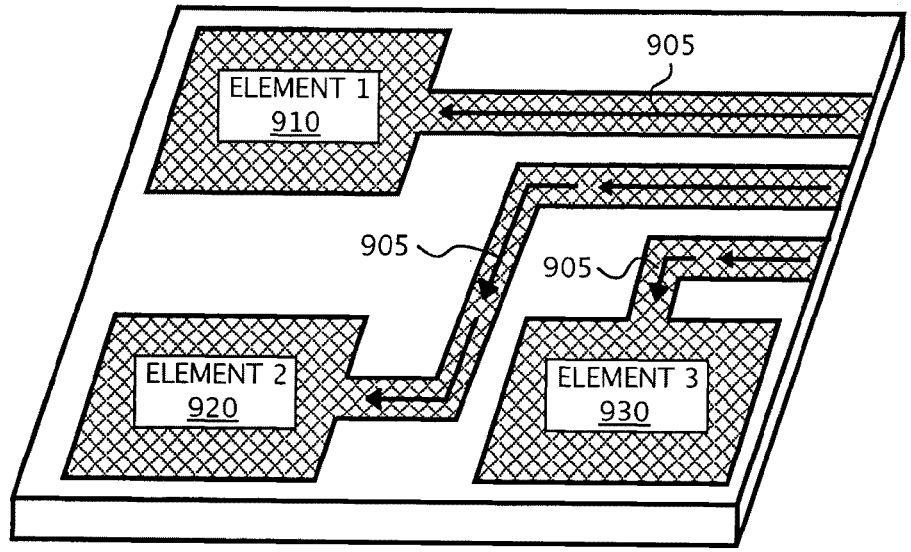
FIGS. 9A and 9B show how a CNT array can be used for photon-coupling in wireless interconnections according to some embodiments.
Figure 9B:
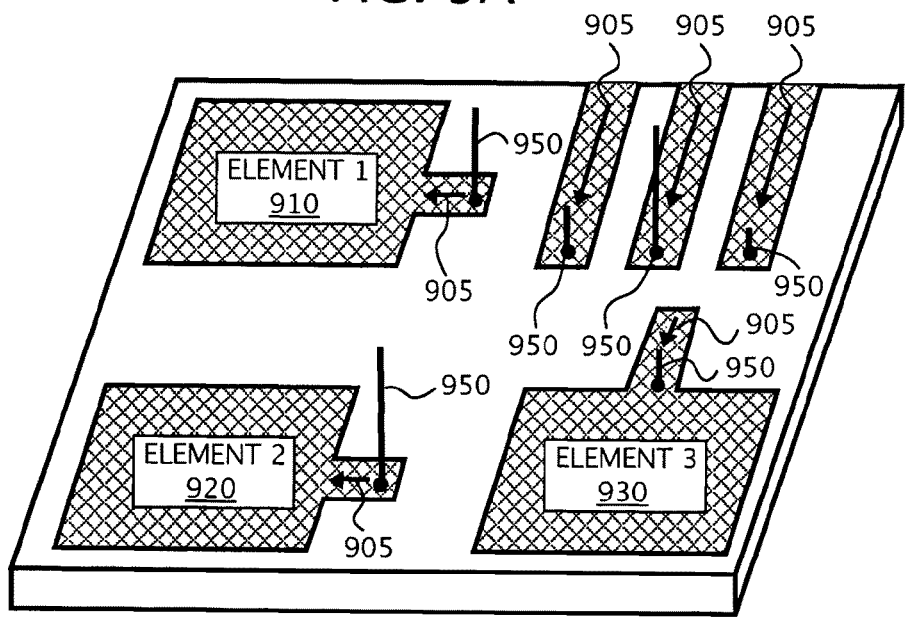

FIGS. 9A and 9B show how a CNT array can be used for photon-coupling in wireless interconnections according to some embodiments. In FIG. 9A, a conventional interconnection is used to transmit signals 905 to a first element 910, a second element 920, and third element 930. In FIG. 9B, CNTs 950 are used to transmit the signals 905.

EXAMPLE 5

A CNT Signal Modulator

Figure 10:
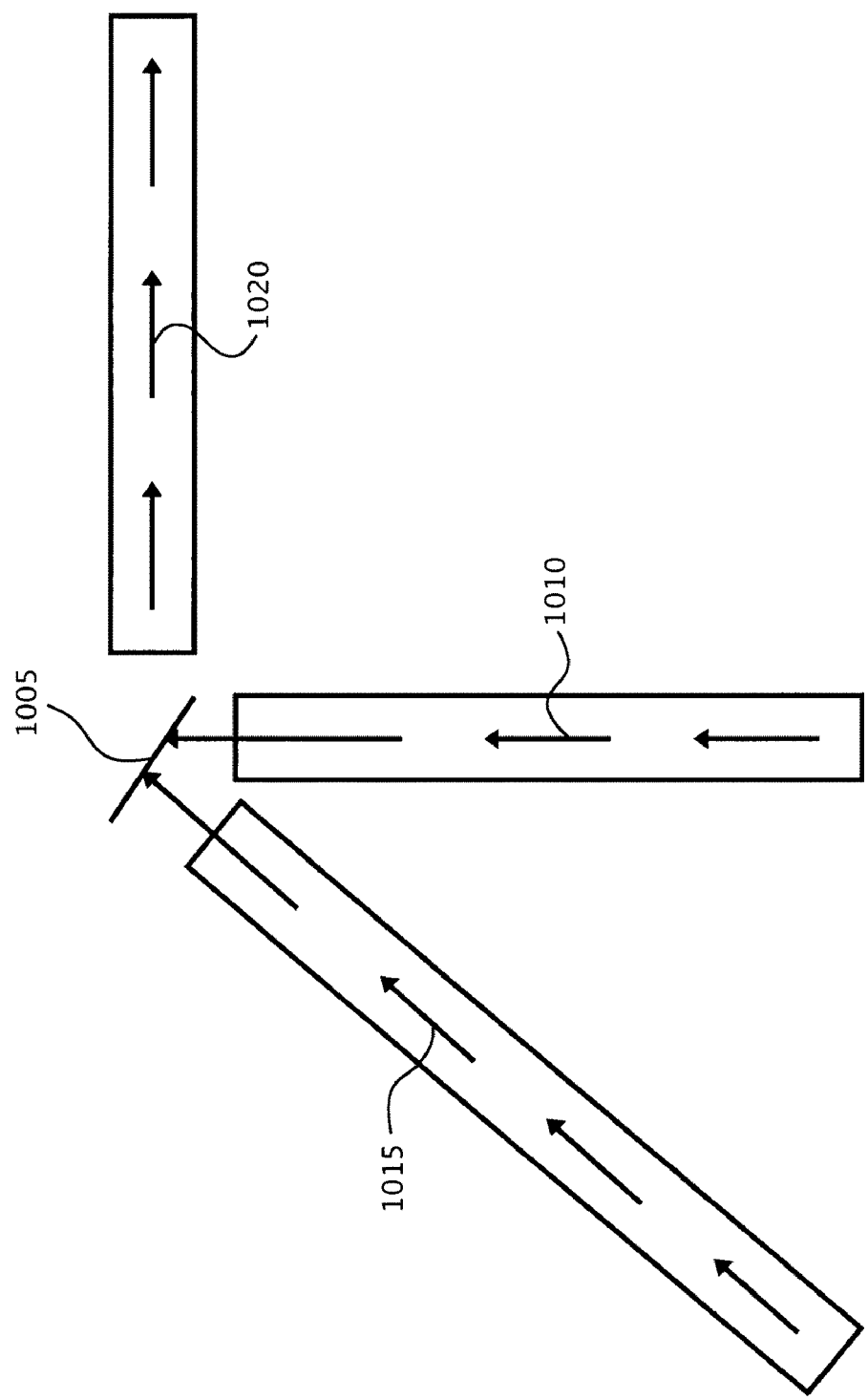
FIG. 10 illustrates a CNT signal modulator having a gate CNT on a substrate and an input modulation signal sender for sending the input modulation signal to the gate CNT and creating a modulated output photonic signal according to some embodiments.

FIG. 10 illustrates a CNT signal modulator having a gate CNT on a substrate and an input modulation signal sender for sending the input modulation signal to the gate CNT and creating a modulated output photonic signal according to some embodiments. The gate CNT 1005 on a substrate in a position for (i) receiving an input photonic signal 1010 and an input modulation signal 1015, wherein the input modulation signal 1015 comprises a photon or an electron; and (ii) transmitting an output photonic signal 1020 that is reduced, eliminated, or enhanced through the selection of the input modulation signal 1015 to provide a modulated output photonic signal 1020

The input modulation signal 1015 can comprise a photon having a predetermined phase alignment with the input photonic signal, wherein the phase alignment is selected to reduce, eliminate, or enhance the modulated output photonic signal by affecting the resonance interaction of the photons at the gate CNT. In some embodiments, the input modulation signal can comprise an electron having a current that is controllable using electronic methods known to one of skill to reduce, eliminate, or enhance the modulated output photonic signal from the gate CNT. In some embodiments, the input modulation signal can comprise an electron having a current that is controllable to change the orientation of the gate CNT on the substrate to reduce, eliminate, or enhance the modulated output photonic signal from the gate CNT.

EXAMPLE 6

A Metal-Coated CNT

Figure 11A:
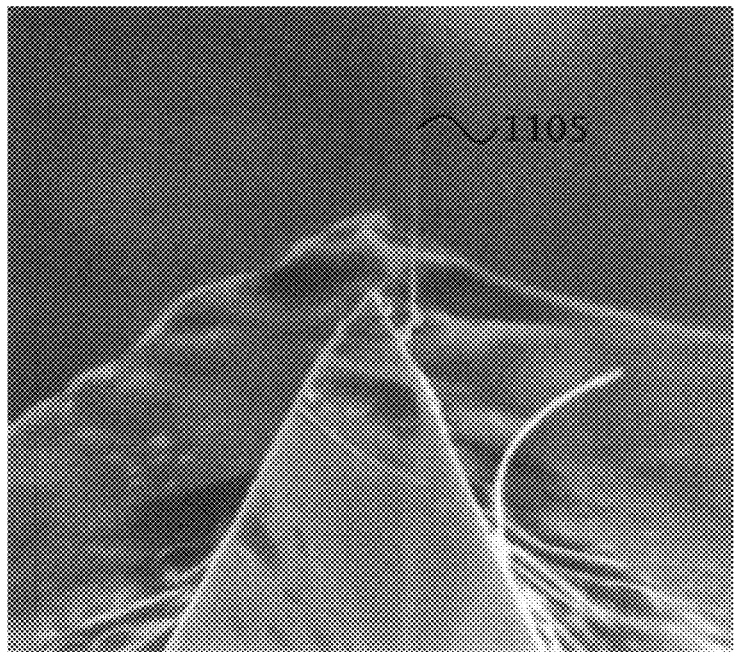
FIGS. 11A and 11B illustrate a CNT before metal deposition and after electron-beam-induced deposition (EBID) of platinum on the CNT according to some embodiments.
Figure 11B:
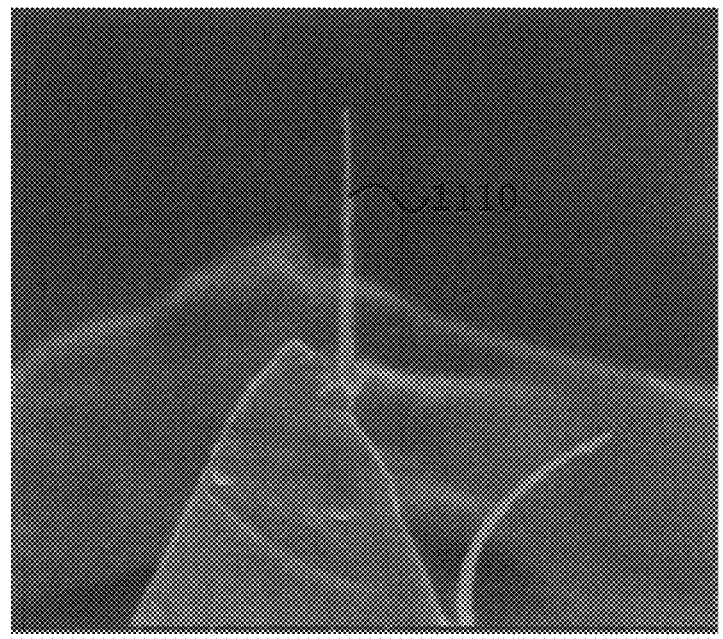

FIGS. 11A and 11B illustrate a CNT before metal deposition and after electron-beam-induced deposition (EBID) of platinum on the CNT according to some embodiments. FIG. 11A shows the CNT 1105 before deposition of the platinum. Nanoscale-sized metals can be used to coat the CNT to enhance the photonic interaction of the CNT, wherein the nanoscale metal can serve as a photonic oscillator. FIG. 11B shows the CNT 1110 after deposition of the platinum coating.

The foregoing description of the invention has been presented for purposes of illustration and description and is not intended to be exhaustive or to limit the invention to the precise form disclosed. Many modifications and variations are possible in light of the above teaching. For example, there are several additional applications for the carbon nanotube signal modulators taught herein that would be considered by one of skill. The embodiments disclosed were not intended to be all-inclusive but, rather, were meant only to explain the principles of the invention and its practical application to thereby enable others skilled in the art to best use the invention in various embodiments and with various modifications suited to the particular use contemplated.

We claim:

1. A carbon nanotube (CNT) signal modulator comprising:
 a plurality of CNT structures fabricated in position over a substrate, each of the plurality of CNTs operating as a gate CNT in position for (i) receiving an input photonic signal and an input modulation signal, wherein the input modulation signal comprises a photon or an electron; and (ii) transmitting an output photonic signal that is reduced, eliminated, or enhanced through the selection of the input modulation signal to provide a modulated output photonic signal, wherein said receiving and transmitting operations of the gate CNT are performed entirely by one of the plurality of CNT structures, and wherein said input photonic signal is scattered or otherwise modulated at said one of the plurality of CNT structures for generating said modulated output photonic signal; and
 an input modulation signal sender for sending the input modulation signal to the gate CNT and creating the modulated output photonic signal from the gate CNT.

2. The CNT signal modulator of claim 1, wherein the input modulation signal comprises a photon having a predetermined phase alignment with the input photonic signal, wherein the phase alignment is selectable to reduce, eliminate, or enhance the modulated output photonic signal by affecting the resonance interaction of the photons at the gate CNT.

3. The CNT signal modulator of claim 1, wherein the input modulation signal comprises an electron having a current that is controllable to reduce, eliminate, or enhance the modulated output photonic signal from the gate CNT.

4. The CNT signal modulator of claim 1, wherein the input modulation signal comprises an electron having a current that is controllable to change the orientation of the gate CNT on the substrate to reduce, eliminate, or enhance the modulated output photonic signal from the gate CNT.

5. The CNT signal modulator of claim 1, wherein the signal modulator is an on/off logic device.

6. The CNT signal modulator of claim 1, wherein the signal modulator is a multi-gate logic device having multiple gate CNTs.

7. The CNT signal modulator of claim 1, wherein the input modulation signal sender and the CNT are positioned on the same substrate.

8. The CNT signal modulator of claim 1, wherein a portion of the CNT is coated with a metal that enhances the output photonic signal.

9. The CNT signal modulator of claim 8, wherein the metal comprises gold, silver, or platinum.

10. A process for creating the CNT signal modulator of claim 1, the process comprising
fabricating the gate CNT on the substrate in a position for (i) receiving the input photonic signal and the input modulation signal, wherein the input modulation signal comprises the photon or the electron; and (ii) transmitting the output photonic signal that is reduced, eliminated, or enhanced through the selection of the input modulation signal to provide the modulated output photonic signal; and
positioning the input modulation signal sender for sending the input modulation signal to the gate CNT and creating the modulated output photonic signal.

11. The process of claim 10, wherein the process includes positioning the input modulation signal sender on the same substrate as the gate CNT.

12. The process of claim 10, wherein the fabricating includes coating a portion of the gate CNT with a metal that enhances the output photonic signal.

13. The process of claim 12, wherein the metal comprises gold, silver, or platinum.

14. The process of claim 10, wherein the input modulation signal comprises a photon having a predetermined phase alignment with the input photonic signal, wherein the phase alignment is selectable to reduce, eliminate, or enhance the modulated output photonic signal by affecting the resonance interaction of the photons at the gate CNT.

15. The process of claim 10, wherein the input modulation signal comprises an electron having a current that is controllable to reduce, eliminate, or enhance the modulated output photonic signal from the gate CNT.

16. The process of claim 10, wherein the input modulation signal comprises an electron having a current that is controllable to change the orientation of the gate CNT on the substrate to reduce, eliminate, or enhance the modulated output photonic signal from the gate CNT.

17. The process of claim 10, wherein the signal modulator is an on/off logic device.

18. The process of claim 10, wherein the signal modulator is a multi-gate logic device having multiple gate CNTs.

19. A method of transmitting a modulated output photonic signal using the CNT signal modulator of claim 1, comprising:
sending the input photonic signal to the gate CNT;
sending the input modulation signal to the gate CNT to create the modulated output photonic signal, wherein the input modulation signal comprises the photon or the electron; and
transmitting the modulated output photonic signal.

20. The method of claim 19, wherein the input modulation signal comprises a photon having a predetermined phase alignment with the input photonic signal, wherein the phase alignment is selectable to reduce, eliminate, or enhance the modulated output photonic signal by affecting the resonance interaction of the photons at the gate CNT.

21. The method of claim 19, wherein the input modulation signal comprises an electron having a current that is controllable to reduce, eliminate, or enhance the modulated output photonic signal from the gate CNT.

22. The method of claim 19, wherein the input modulation signal comprises an electron having a current that is controllable to change the orientation of the gate CNT on the substrate to reduce, eliminate, or enhance the modulated output photonic signal from the gate CNT.

23. The method of claim 19, wherein the signal modulator is an on/off logic device.

24. The method of claim 19, wherein the signal modulator is a multi-gate logic device having multiple gate CNTs.

25. A process for creating a photonic transmission device, the process comprising:
fabricating a plurality of CNTs, each having functional antenna forms that are capable of a resonance interaction of photons between adjacent CNTs when formed as an array on a substrate
forming the array of CNTs on the substrate, wherein each CNT in the array has (i) a substantially parallel orientation to the adjacent CNTs and (ii) a diameter and length suitable to allow for the resonance interaction of the photons between adjacent CNTs in the array; and
adding a carbon nanotube (CNT) signal modulator comprising:
a plurality of CNT structures fabricated in position over a substrate, each of the plurality of CNTs operating as a gate CNT in position for (i) receiving an input photonic signal and an input modulation signal, wherein the input modulation signal comprises a photon or an electron; and (ii) transmitting an output photonic signal that is reduced, eliminated, or enhanced through the selection of the input modulation signal to provide a modulated output photonic signal, wherein said receiving and transmitting operations of the gate CNT are performed entirely by one of the plurality of CNT structures, and wherein said input photonic signal is scattered or otherwise modulated at said one of the plurality of CNT structures for generating said modulated output photonic signal, and
an input modulation signal sender for sending the input modulation signal to the gate CNT and creating the modulated output photonic signal from the gate CNT.

26. The process of claim 25, wherein the gate CNT is created within the plurality of CNTs for transmitting the modulated output photonic signal.

27. The process of claim 25, wherein the input modulation signal comprises a photon having a predetermined phase alignment with the input photonic signal, wherein the phase alignment is selectable to reduce, eliminate, or enhance the modulated output photonic signal by affecting the resonance interaction of the photons at the gate CNT.

28. The process of claim 25, wherein the input modulation signal comprises an electron having a current that is controllable to reduce, eliminate, or enhance the modulated output photonic signal from the gate CNT.

29. The process of claim 25, wherein the input modulation signal comprises an electron having a current that is controllable to change the orientation of the gate CNT on the substrate to reduce, eliminate, or enhance the modulated output photonic signal from the gate CNT.

30. The process of claim 25, wherein the signal modulator is an on/off logic device.

31. The process of claim 25, wherein the signal modulator is a multi-gate logic device having multiple gate CNTs.

32. A photonic transmission device comprising:
a plurality of CNTs, each having functional antenna forms that are capable of a resonance interaction of photons between adjacent CNTs when formed as an array on a substrate;
wherein each CNT in the array has (i) a substantially parallel orientation to the adjacent CNTs and (ii) a diameter and length suitable to allow for the resonance interaction of the photons between adjacent CNTs in the array; and
a carbon nanotube (CNT) signal modulator comprising:
a plurality of CNT structures fabricated in position over a substrate, each of the plurality of CNTs operating as a gate CNT in position for (i) receiving an input photonic signal and an input modulation signal, wherein the input modulation signal comprises a photon or an electron; and (ii) transmitting an output photonic signal that is reduced, eliminated, or enhanced through the selection of the input modulation signal to provide a modulated output photonic signal, wherein said receiving and transmitting operations of the gate CNT are performed entirely by one of the plurality of CNT structures, and wherein said input photonic signal is scattered or otherwise modulated at said one of the plurality of CNT structures for generating said modulated output photonic signal, and
an input modulation signal sender for sending the input modulation signal to the gate CNT and creating the modulated output photonic signal from the gate CNT.

33. The device of claim 32, wherein the gate CNT is created within the plurality of CNTs for transmitting the modulated output photonic signal.

34. The device of claim 32, wherein the input modulation signal comprises a photon having a predetermined phase alignment with the input photonic signal, wherein the phase alignment is selectable to reduce, eliminate, or enhance the modulated output photonic signal by affecting the resonance interaction of the photons at the gate CNT.

35. The device of claim 32, wherein the input modulation signal comprises an electron having a current that is controllable to reduce, eliminate, or enhance the modulated output photonic signal from the gate CNT.

36. The device of claim 32, wherein the input modulation signal comprises an electron having a current that is controllable to change the orientation of the gate CNT ori the substrate to reduce, eliminate, or enhance the modulated output photonic signal from the gate CNT.

37. The device of claim 32, wherein the signal modulator is an on/off logic device.

38. The device of claim 32, wherein the signal modulator is a multi-gate logic device having multiple gate CNTs.

* * * * *